United States Patent [19]
Yan et al.

[11] Patent Number: 5,812,631
[45] Date of Patent: Sep. 22, 1998

[54] METHOD FOR MANUFACTURING MONOLITHIC CAPILLARY X-RAY LENS, A MONOLITHIC CAPILLARY X-RAY LENS AND APPARATUS USING SAME

[75] Inventors: Yiming Yan; Yejun He; Xunliang Ding; Dachun Wang; Andong Liu; Baozhen Chen; Fuzhong Wei, all of Beijing, China

[73] Assignee: China Aerospace Corporation and Beijing Normal University, Beijing, China

[21] Appl. No.: 799,948

[22] Filed: Feb. 14, 1997

[30]     Foreign Application Priority Data

Feb. 17, 1996 [CN]  China ................ 96 1 01194.7

[51] Int. Cl.$^6$ ........................................ G21K 1/06
[52] U.S. Cl. ........................ 378/85; 378/71; 378/145
[58] Field of Search .................. 378/145, 84, 85, 378/71

[56]          References Cited

U.S. PATENT DOCUMENTS 5,175,755  12/1992  Kumakhov ............................ 378/34
5,192,869   3/1993  Kumakhov .......................... 250/505.1
5,497,008   3/1996  Kumakhov .......................... 250/505.1

*Primary Examiner*—Craig E. Church
*Attorney, Agent, or Firm*—Skjerven, Morrill, MacPherson, Franklin & Friel LLP; David E. Steuber

[57]              ABSTRACT

A method for manufacturing the monolithic capillary X-ray lens, comprising the steps of Drawing a hollow glass raw-tube into monocapillaries in a heating furnace by a drawing tower; Stacking monocapillaries into a symmetric mould to form a multibundle; Feeding the multibundle into the heating furnace to be heated at uniform speed or variable speed; Drawing the multibundle by a drawing tower at uniform speed and variable speed to form a first integrated lens billet; Cutting the monolithic lens billet into desired shape according to usage to form said first monolithic capillary X-ray lens. A monolithic capillary X-ray lens produced by using said method comprises a plurality of X-ray channels passing from one end through another end, and is a single glass solid formed by melting together the walls themselves of said X-ray channels. An X-ray diffractometer employing said lens comprises an X-ray source, a sample, a detector, a high voltage power supply, an amplifier, a pulse analyzer, a scaler, a ratemeter, a computer, an X-ray source control system and a goniometer, wherein the monolithic capillary X-ray lens are disposed between the X-ray source and the sample and/or between the sample and the detector.

33 Claims, 8 Drawing Sheets

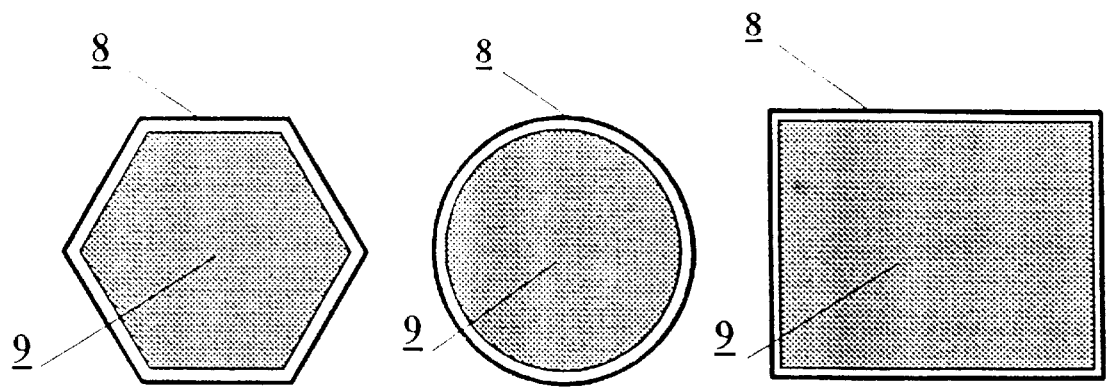
Fig. 7  Fig. 8  Fig. 9
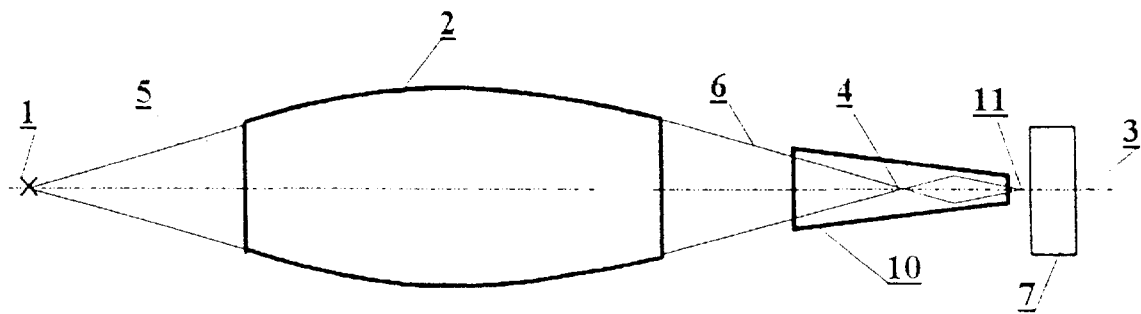
Fig. 10
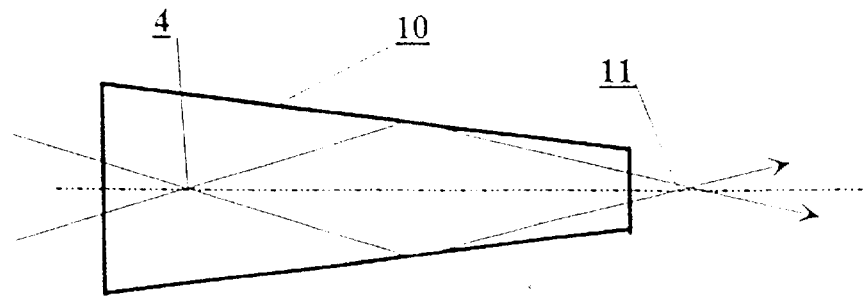
Fig. 11

METHOD FOR MANUFACTURING MONOLITHIC CAPILLARY X-RAY LENS, A MONOLITHIC CAPILLARY X-RAY LENS AND APPARATUS USING SAME

FIELD OF THE INVENTION

The present invention relates to a method for manufacturing an X-ray optical control device, an optical control device for X-ray and apparatus using the same.

BACKGROUND OF THE INVENTION

Kumakhov proposed some methods for focusing X-ray beams based on the well known principle that X-ray may be transmitted by single or multiple reflections on smooth surfaces, wherein one of those methods is the employing of x-ray guiding a combination of a plurality of channels to converge divergent X-rays at large angles. The X-ray focusing device employing the above-mentioned method is formed by passing a plurality of X-ray guiding channels through a metallic frame with fixed space. There are three shortcomings of this X-ray focusing device: firstly, it is constituted by assembling a plurality of individual channels, therefore, its structure is loose and subject to damage in use and transportation; secondly, there are large spaces between the channels and the channels are very long, therefore the X-ray transmission efficiency of such X-ray focusing device is very low; and finally, such assembling scheme makes the whole focusing device bulky and inconvenient in use, it also can not meet the requirement of high intensity X-ray beam in many situations.

U.S. Pat. No. 5,192,869 disclosed a device for controlling beams of particles, X-ray and gamma quanta, comprising a plurality of channels having inner surfaces exhibiting multiple total external reflections, input butt-ends facing a radiation source, and output butt-ends aimed at a radiation receiver, said channels being formed by channel-forming elements located along generatrices of imaginary controlled surfaces, said channel-forming elements are rigidly located relative to one another at multiple locations by means of a rigid support structure, said plurality of channel supporting means being mounted along said channels with a spacing of supports less than, or equal to, the spacing at which sagging of the channel-forming elements begins to interfere with beam propagation for the radiation spectrum for which high transmission efficiency is desired. Wherein said rigid support structures are formed by the walls of said channels being rigidly linked by their outer surfaces. However, it did not disclose a method for manufacturing said device and it is difficult for skills in the art to produce said device without being provided a particular manufacturing method. Furthermore, it is still remains desirable to provide a monolithic capillary X-ray lens which has more compact and miniature structure, high mechanical strength and high X-ray transmission efficiency.

SUMMARY OF THE INVENTION

Accordingly, it is an object of the present invention to provide a method for manufacturing a monolithic capillary X-ray lens, it is another object of the present invention to provide a monolithic capillary X-ray lens, which has compact and miniature structure, high mechanical strength and high X-ray transmission efficiency, produced by using above-mentioned method.

It is yet another object of the present invention to provide an optical apparatus using this monolithic capillary X-ray lens.

According to one aspect of the present invention, there is provided a method for manufacturing a monolithic capillary X-ray lens, comprising the steps of:

1). Drawing a hollow glass raw-tube into monocapillaries in a heating furnace by a drawing tower;

2). Stacking monocapillaries into a symmetric mould to form a first multibundle;

3). Feeding the multibundle into the heating furnace to be heated at uniform speed or variable speed;

4). Drawing the multibundle by a drawing tower at uniform speed and variable speed to form a first integrated lens billet;

5). Cutting the monolithic lens billet into desired shape according to usage to form said monolithic capillary X-ray lens.

According to another aspect of the present invention, there is provided a method for manufacturing a monolithic capillary X-ray lens, comprising the steps of:

1). Drawing a hollow glass raw-tube into monocapillaries in a heating furnace by a drawing tower;

2). Stacking monocapillaries into a symmetric mould to form a first multibundle;

3) drawing the above-mentioned first multibundle with the same method of said step 1) to form multichannel capillary of smaller diameter or diameter across sides, which are referred to as second multicapillaries;

4) forming a second multibundle by applying the same method of said step 2) with the first multicapillaries;

5). Feeding the second multibundle into the heating furnace to be heated at uniform speed or variable speed;

6). Drawing the second multibundle by a drawing tower at uniform speed and variable speed to form a second integrated monolithic lens billet;

7). Cutting the second monolithic lens billet into desired shape according to usage to form a monolithic capillary X-ray lens.

wherein between step 1) and step 6), by repeatly using the method described in the above mentioned steps 2) to 5) N times according to the usage, a (N+2)th monolithic capillary X-ray lens can be formed, said N is a positive integral more than 0

According to yet another aspect of the present invention, there is provided a monolithic capillary X-ray lens, comprising a plurality of X-ray guiding channels from one end through the other end, and is a single glass solid formed by melting together the walls themselves of said X-ray guiding channels.

X-ray can be propagated from one end to the other of said glass solid with the help of the total reflection of the inner walls of said X-ray channels, and the X-ray guiding propagation direction can be varied by different shapes and sizes of said glass solid and X-ray guiding channels. The X-ray lens of the present invention includes a monolithic capillary focusing X-ray lens for controlling X-ray in wide wavelength range and focusing X-ray into very small beam spot and a monolithic capillary quasi-parallel beam X-ray lens for converting X-ray into quasi-parallel beams; or on the other hand, monolithic capillary quasi-parallel beam focusing X-ray lens for focusing quasi-parallel beams into a very small beam spot.

The longitudinal profile generatrices of said lens and the profile generatrices of the X-ray guiding channels and the axes of the X-ray guiding channels are approximately segments of space conics, combinations of segments of conics, or combinations of segments of conics and straight lines. The radial variations of the profile generatrices of the lens and that of the X-ray guiding channels are symmetric with respect to the imaginary axis of X-ray. Thus, a more reasonable lens structure can be obtained and the loss of X-ray during the reflection process in the channels can be reduced, thereby the transmission efficiency of X-ray can be improved.

According to yet another aspect of the present invention, there is provided an X-ray fluorescence spectrometer using the above-mentioned monolithic capillary X-ray lens constituted by an X-ray source, a sample, an X-ray lens disposed between the X-ray source and the sample, a detector, an amplifier, and a PC based multi-analyzer, Wherein said X-ray lens disposed between the X-ray source and the sample is said monolithic capillary focusing X-ray lens. The X-rays within a considerably large solid angle emitted by the X-ray source are collected and focused by the monolithic capillary focusing X-ray lens to form an X-ray micro-beam spot of high power density and be focused on the sample to be measured. After the elements in the sample are activated, the emitted characteristic X-ray is incident upon the detector, the output from the detector is amplified by the amplifier and then is analyzed and stored by the PC based multi-analyzer.

According to yet another aspect of the present invention, there is provided an X-ray diffractometer using said monolithic capillary X-ray lens constituted by an X-ray source, a sample, an X-ray lens, a detector, a high voltage power source, an amplifier, a pules analyzer, a scaler, a rate meter, a PC, an X-ray control system and a goniometer, wherein: said monolithic capillary quasi- parallel beam X-ray lens is added between the X-ray source and the sample, and/or said monolithic capillary quasi-parallel beam focusing X-ray lens is added between the sample and the detector. The X-rays emitted by the X-ray source are collected by the monolithic capillary quasi-parallel beam X-ray lens and converted into quasi-parallel X-rays, which are then imposed on the sample to produce diffracted X-rays. The diffracted X-rays are further collected by the monolithic capillary quasi-parallel beam focusing X-ray lens and focused into the detector, the output from the detector is sent to the PC via the amplifier and the pulse analyzer for further processing.

According to yet another aspect of the present invention, there is provided a deep submicron X-ray lithography apparatus using said monolithic capillary X-ray lens comprising a pulse plasma soft X-ray source, a stepper having masks and wafers thereon, a vacuum device, associated power sources, and control systems, wherein said monolithic capillary quasi-parallel beam X-ray lens is disposed between the X-ray source and the stepper. The X-rays emitted by the X-ray source are collected by the monolithic capillary quasi-parallel beam X-ray lens to form a quasi-parallel X-ray beam with uniform large illuminating area and project to the stepper, the quasi-parallel X-ray beam transmits through the mask and transfers the patterns on the mask onto the resist on the wafers, and thus an exposure procedure for the deep submicron lithography is completed.

BRIEF DESCRIPTION OF THE DRAWINGS

The above and other objects and features of the present invention will become apparent from the following description of preferred embodiments given in conjunction with the accompanying drawings, in which.

FIG. 7 is a schematic diagram of a regular hexagonal section along A—A of FIG. 1 and FIG. 4;

FIG. 8 is a schematic diagram of a circular section along A—A of FIG. 1 and FIG. 4;

FIG. 9 is a schematic diagram of a rectangular section along A—A of FIG. 1 and FIG. 4;

FIG. 10 is a schematic diagram of the structure of the combination of a monolithic capillary focusing X-ray lens and a guiding capillary;

FIG. 11 is a schematic diagram of the structure of the conical guiding capillary in FIG. 10;

DETAILED DESCRIPTION OF THE INVENTION

Figure 1:
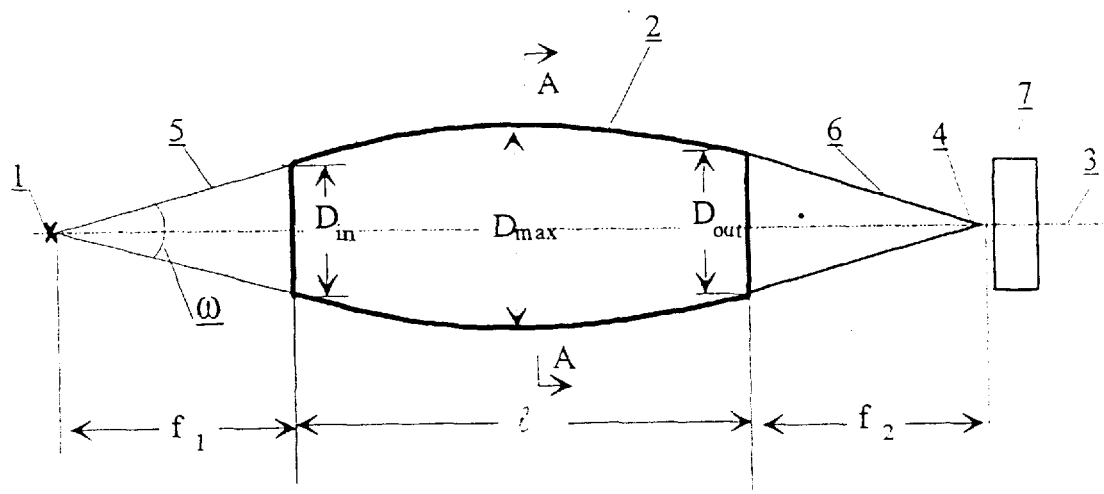
FIG. 1 is a schematic diagram of the structure of a monolithic capillary focusing X-ray lens.
Figure 2:
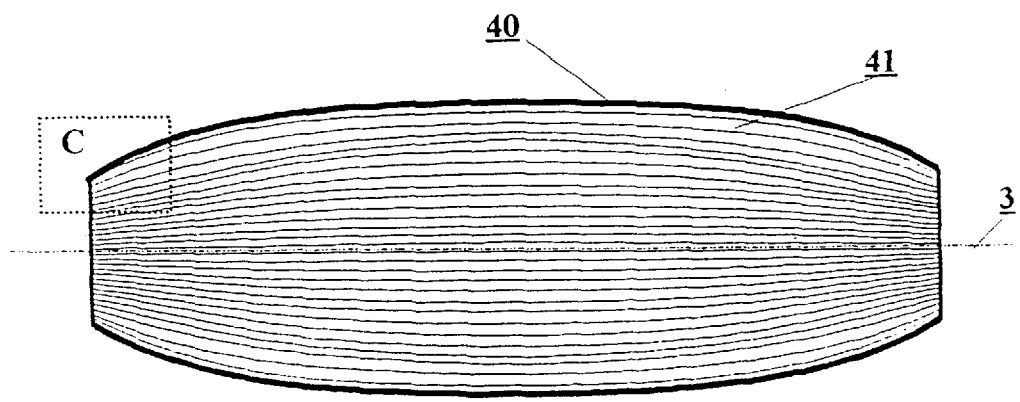
FIG. 2 is an axial sectional view of a monolithic capillary focusing X-ray lens.
Figure 3:
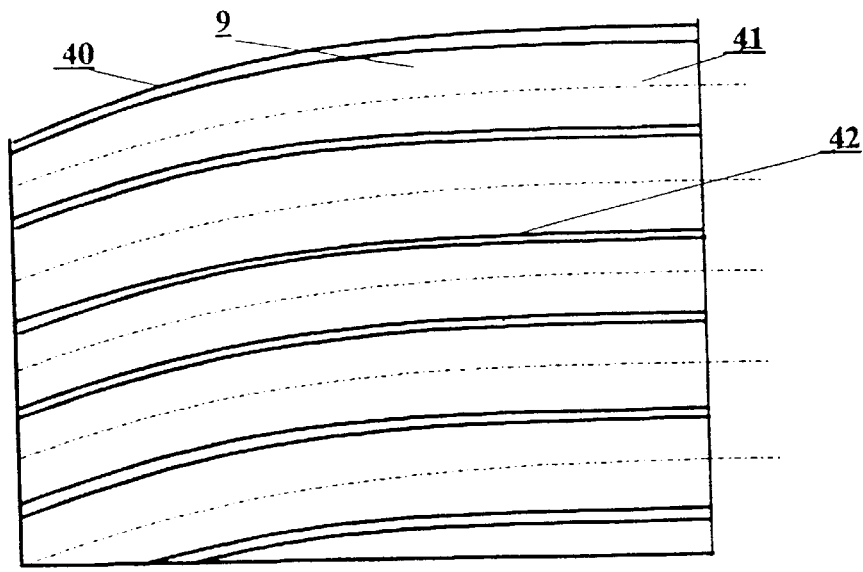
FIG. 3 is a partial enlarged diagram of portion C in FIG. 2.

FIG. 1, 2 and 3 show the structural principle of the monolithic capillary focusing X-ray lens, where the sizes of the incident and exit sections of the monolithic capillary X-ray lens are less than the maximum sectional size thereof, the longitudinal profile generatrix 40 of the lens 2 and the profile generatrices 42 of the X-ray guiding channels 9 and the axes 41 of the X-ray guiding channels are approximately segments of space conics, or combinations of segments of conics, or combinations of segments of conics and straight lines, the radial variations of the profile generatrix 42 of the lens 2 and the profile generatrices 40 of the X-ray guiding channels are symmetric with respect to the imaginary axis 3 of X-ray. FIGS. 7, 8 and 9 are three sectional schematic diagrams showing the A—A section of a monolithic capillary focusing X-ray lens 2, i. e., regular hexagonal, circular and rectangular. In the above Figures, 1 denotes the X-ray source, 2 denotes the monolithic capillary focusing X-ray lens, 3 denotes the imaginary X-ray axis of the lens, 4 denotes the X-ray focal spot, 5 denotes the X-ray incident on the lens, 6 denotes the X-ray focused onto the focal spot from the lens, 7 denotes the detector and 9 is the X-ray guiding channel. A rigid solid envelope 8 is added to the periphery of the lens 2 in order to overcome the defects of the internal structure of the lens, to improve the optical performance of the lens and to increase its mechanical strength. The distance from the X-ray source to the incident end of the lens 2, i.e., the focal length f1, is about 10 mm–200 mm, the distance from the exit end of the lens 2 to the focal spot 4, i.e., the focal length f2 is 10 mm–500 mm, the length of the lens is 25 mm–200 mm, the size of the incident end of the lens $D_{in}$ is 1 mm–30 mm (it is the diameter for circular lens, the distance between two opposite sides for regular polygons, and the minimum length between two opposite sides for rectangles), the size of the exit end of the lens $D_{out}$ is 1 mm–35 mm, and the open area is greater than 5%.

The variations of the size of the inner radius of the X-ray guiding channel 9 and that of the section of the lens 2 are continuous and synchronous with each other, that is when the section of the lens 2 is small, the inner radius of the X-ray guiding channel is also small, and when the size of the section of the lens 2 arrives at its maximum $D_{max}$, the inner radius of the X-ray guiding channel 9 is also at its maximum.

In order to improve the transmission efficiency of the peripheral guiding channels of the monolithic capillary focusing X-ray lens, the size of the X-ray guiding channel 9 is different at different positions on the section perpendicular to the X-ray axis 3 of the lens, for example, the X-ray guiding channel 9 close to the X-ray axis 3 has a larger size, while the X-ray guiding channel 9 distant from the X-ray axis 3 has a smaller size.

Two examples of the monolithic capillary focusing X-ray lens are given hereinafter. The first monolithic capillary focusing X-ray lens is formed by two composite drawings, which has 250507 X-ray guiding channels in total, the longitudinal profile generatrix 40 of the lens 2, the profile generatrices 42 of the X-ray guiding channels 9, and the axes 41 of the X-ray guiding channels 9 are formed by combinations of straight line segments, rotating ellipsoid line segments, straight line segments, rotating ellipsoid line segments and line segments, the length of the lens 1 is 50 mm, the lens has a section of regular hexagon with a distance between two opposite sides of $D_{in}$=6.7 mm at the incident end, and $D_{out}$=5.2 mm at the exit end, and $D_{max}$=7.4 mm at the maximum section of the lens, focal length f1=44 mm, focal length f2=33 mm, X-ray collection angle ω=150 mrad. Using X-ray of 8.04 KeV emitted by an isotropic point beam spot X-ray source of 0.1 mm in diameter, the transmission efficiency of the lens was measured to be η=5%, the diameter of the focused beam spot S=157 μm, the amplification of the lens K=760, and the univalent distance Leq=4.6 mm.

The second monolithic capillary focusing X-ray lens is formed by one composite drawing, which has 5677 X-ray guiding channels in total, the longitudinal profile generatrix 40 thereof, the profile generatrices 42 of the X-ray channels, and the axes 41 of the X-ray guiding channels 9 are similar to that of the first example, the length of the lens 1 is 54 mm, the lens has a section of regular hexagon, the distance between two opposite sides is $D_{in}$=6.9 mm at the incident end, and $D_{out}$=6.65 mm at the exit end, and $D_{max}$=8.87 mm at the maximum section of the lens, focal length f1=81 mm, focal length f2=40 mm, collection angle of X-ray ω=110 mrad. For the X-ray of 3.69KeV emitted by an isotropic point beam spot X-ray source of 0.2 mm in diameter, the measured transmission efficiency of the lens is η=19.3%, the diameter of the focused beam spot S=260 μm, the amplification of the lens K=670, the equivalent distance $L_{eq}$=6.8 mm (The above-mentioned transmission efficiency of the lens η is the ratio of the exit X-ray flux to the incident X-ray flux, size S of the focused beam spot is the size of the focused X-ray beam spot on the section perpendicular to the optical axis of the lens at focal length f2, the amplification of the lens K is the ratio of the X-ray power density with an X-ray lens at focal length f2 to the X-ray power density without any X-ray lens thereof, the equivalent distance Leq for isotropic X-ray sources is the distance from the X-ray source, where the X-ray power density of the X-ray beam directly emitted from X-ray source is equal to the power density of the beam of X-rays on the focal spot, when lens is used).

Figure 12:
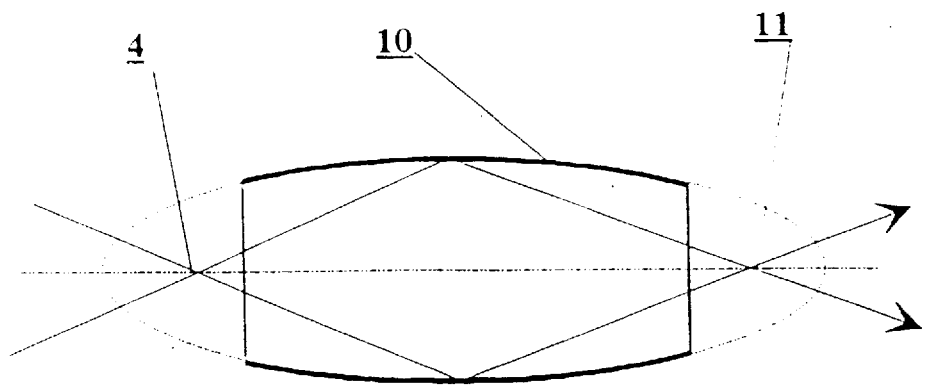
FIG. 12 is a schematic diagram of the structure of the guiding capillary formed by two parts of rotating ellipsoids of FIG. 10.
Figure 13:
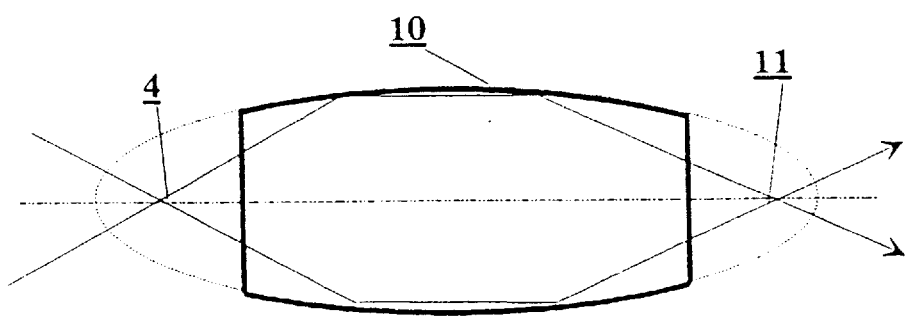
FIG. 13 is a schematic diagram of the structure of the guiding capillary formed by two parts of rotating paraboloids of FIG. 10.

In order to further minimize the X-ray focused beam spot to improve X-ray power density, a guiding capillary 10 (see FIG. 10) or a aperture 12 (see FIG. 14) is added after the monolithic capillary focusing X-ray lens 2 to form a combination of lens and a guiding capillary or a combination of lens and an aperture. 11 in FIGS. 11, 12 and 13 is a guiding capillary focused X-ray beam spot, the shape of the guiding capillary 10 is a hollow conic guiding capillary or a hollow guiding capillary formed by two parts of rotating ellipsoids or a hollow guiding capillary formed by two parts of rotating paraboloids. In FIG. 11, the focused beam spot of lens 2 is positioned inside the conic capillary, and further focused into a smaller beam spot by the conic capillary, and the detector 7 is positioned at the position of the beam spot 11. In FIG. 12, the beam spot focused by the lens is positioned at the first focus of the first rotating ellipsoid, the scattered X-rays inside the ellipsoidal guiding capillary are focused on the second focus of the second ellipsoid and incident on the detector 7 via the capillary mouth. In FIG. 13, the lens focused beam spot is positioned on the focus position of the first rotating paraboloidal guiding capillary, the X-rays emitted by the beam spot are reflected into quasi-parallel beam by the paraboloidal guiding capillary, and these X-rays are focused onto the focus of the second rotating paraboloid thereby and incident on the detector 7 via the capillary mouth, the beam spot is further reduced by the further focusing of the guiding capillary 10 and the limiting of the radius of the capillary mouth.

Figure 14:
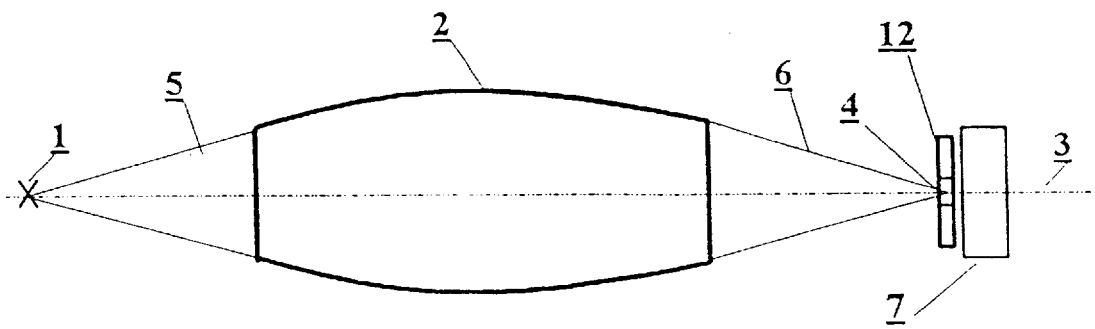
FIG. 14 is a schematic diagram of the structure of the combination of a monolithic focusing X-ray lens and an aperture.

Referring to FIG. 14, an aperture 12 is added after the monolithic capillary focusing X-ray lens to form a combination of lens and aperture, The aperture 12 is made of material of medium or heavy elements, which serves to further limit the size of the X-ray beam spot to have the most intensive portion of the X-rays on the beam spot to be incident onto the detector 7, thereby to obtain a much smaller beam spot and higher X-ray power density.

Figure 4:
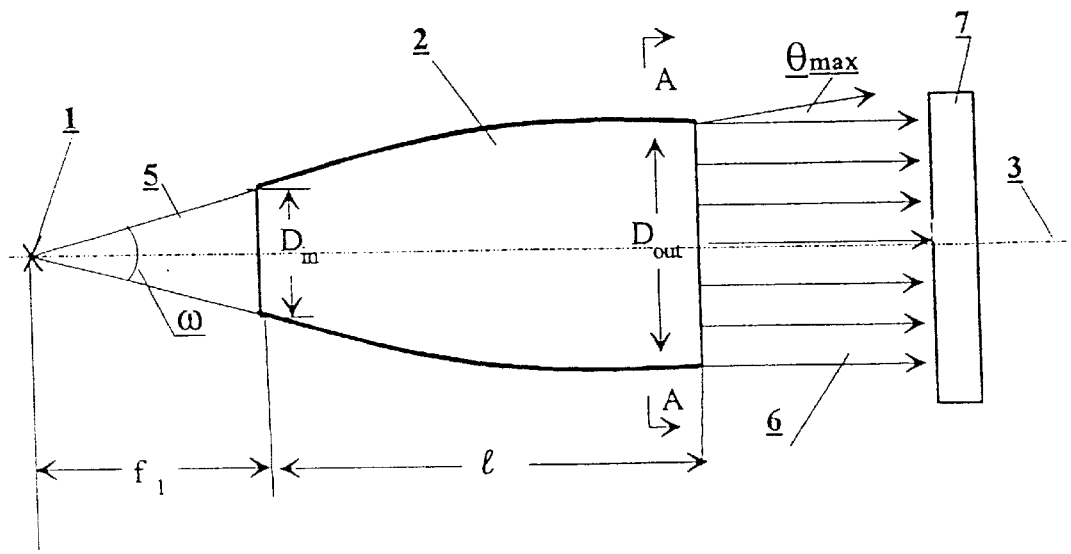
FIG. 4 is a schematic view of the structure of a monolithic capillary quasi-parallel beam X-ray lens.
Figure 5:
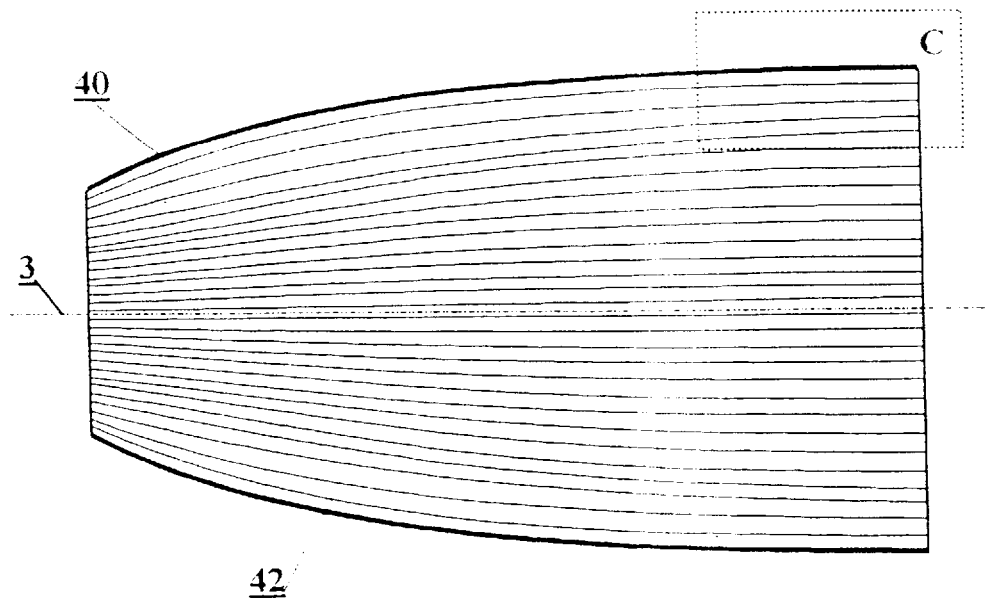
FIG. 5 is an axial sectional view of a monolithic capillary quasi-parallel beam X-ray lens.
Figure 6:
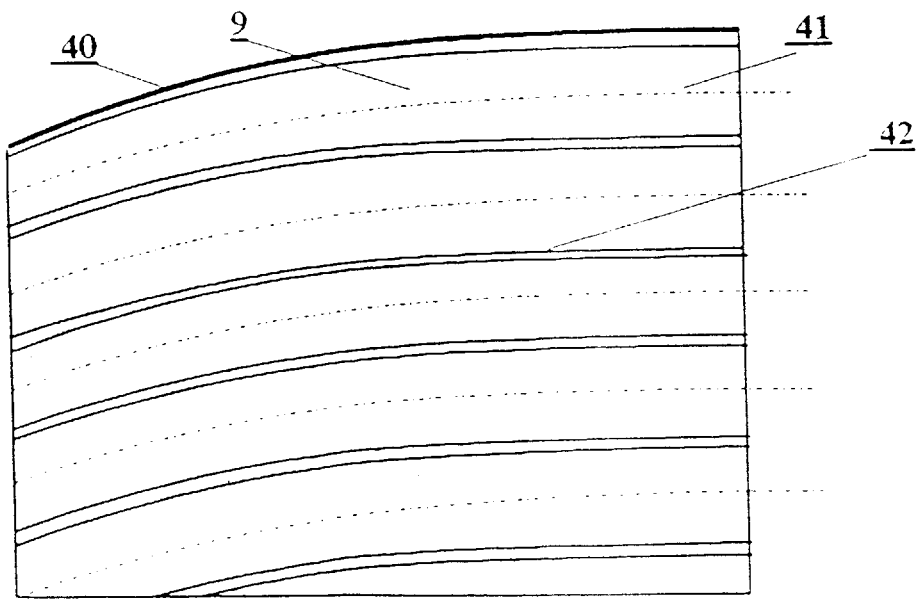
FIG. 6 is a partial enlarged diagram of portion C in FIG. 5.

FIGS. 4, 5 and 6 show the principle of structure of the monolithic capillary quasi-parallel beam X-ray lens 2, the size of the incident end of such lens is less than that of the exit end thereof, the longitudinal profile generatrix 40 of the lens 2, the profile generatrices 42 of the X-ray guiding channels 9 and the axes 41 of the X-ray channels are approximately the combinations of conic segments and straight line segments, the radial variations of the lens profile generatrix 40 and the X-ray channel profile generatrices 42 are symmetric with respect to the imaginary X-ray axis 3, the profile genratrix 40 of the exit portion of the lens is parallel to the imaginary lens X-ray axis 3. FIGS. 7, 8 and 9 are schematic diagrams showing three sections of the A—A section of the monolithic capillary quasi-parallel beam X-ray lens 2, i.e., regular hexagon, circle and rectangle. In the above-mentioned FIGS., 1 is the X-ray source, 2 the monolithic capillary quasi-parallel beam X-ray lens, 3 the imaginary X-ray axis of the lens, 4 the X-ray focal spot, 5 the X-ray incident on the lens, 6 the X-ray exiting from the lens, 7 the detector, and 9 denotes the X-ray channels. A layer of rigid solid envelope 8 is added to the periphery of the lens 2 in order to overcome the internal structural defects of the lens to improve the optical performance of the lens. The distance from the X-ray source 1 to the incident end of the lens 2, i. e., the focal length f1, is 10 mm–200 mm, the length of the lens 1 is 10 mm–250 mm, the size of the incident end of the lens $D_{in}$ is 1 mm–35 mm (it is the diameter for circular lens, and the distance between opposite sides for regular polygon, and the minimum distance between opposite sides for rectangular lens), the size of the exit end of the lens $D_{out}$ is 2 mm–50 mm, the minimum distance from the incident end of the lens to the maximum size portion thereof is 10 mm–150 mm, and the open area is greater than 10%.

In order to improve the uniformity of the exit X-ray area of the monolithic capillary quasi-parallel beam X-ray lens, the X-ray guiding channels 9 have different sizes at different positions of a section perpendicular to the X-ray axis 3 of the lens, for example, the X-ray channels 9 closer to the X-ray axis 3 have larger sizes, and that distant from the X-ray axis 3 have smaller sizes; and the X-ray channels at the incident end of the lens have different focal lengths, for example: the X-ray source is positioned on the focus of peripheral channels rather than on the focus of the central portion of X-ray channels.

The following is an example of a monolithic capillary quasi-parallel beam X-ray lens. This lens is formed by one composite drawing, and has 5677 X-ray channels in total, and this lens is formed by the combination of segments of straight lines, segments of rotating paraboloidal curves, segments of arcs and segments of straight lines, the length of the lens is 44.5 mm, the lens has a section of regular hexagon, the distance between opposite sides at the incident end $D_{in}$=3.2 mm, and that at the exit end $D_{out}$=4.2 mm, focal length f1=124 mm, and collection angle of X-ray $\omega$=23 mrad. For the X-ray of 7.31 keV emitted by an isotropic point beam spot X-ray source of 0.2 mm in diameter, the measured transmission efficiency of the lens $\eta$=26.2%, the maximum divergent angle of the quasi-parallel beams output from the lens $\theta_{max}$=0.5 mrad, and the diameter of illuminating field at 100 mm from the exit of the lens is 4.3 mm.(The maximum divergent angle of the above-mentioned quasi-parallel beam X-ray lens $\theta_{max}$ is the maximum opening angle of the exit quasi-parallel X-ray beams among the channels within the field of illumination, the diameter of field of illumination of the quasi-parallel beam lens is the size of the X-ray beam spot transmitted by the lens on a section at a given distance from the exit of the lens and perpendicular to the lens optical axis).

Figure 15:
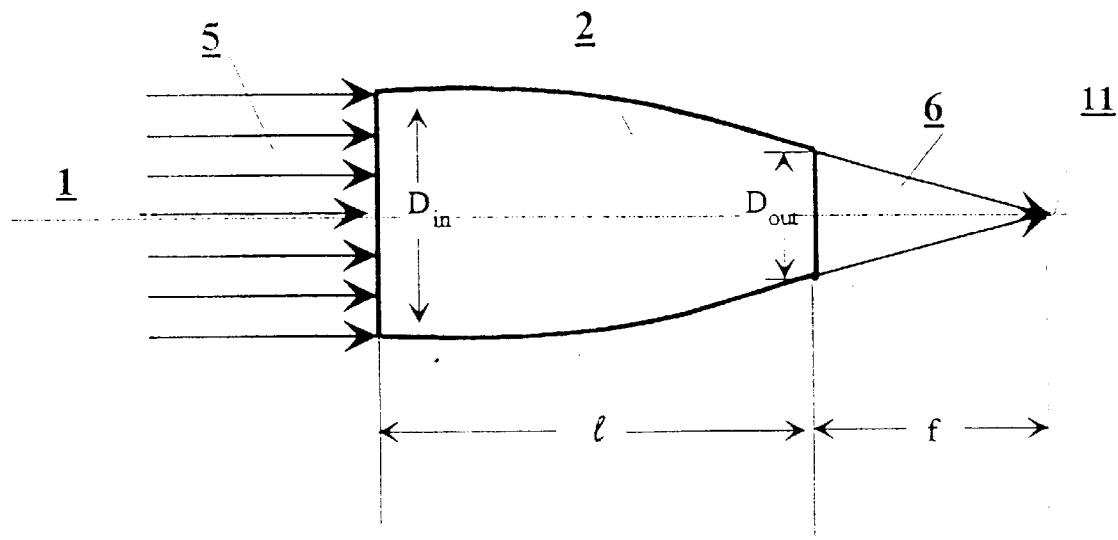
FIG. 15 is a schematic diagram of the structure of the inverted form of a monolithic capillary quasi-parallel beam X-ray lens, i.e., a monolithic capillary quasi-parallel beam focusing X-ray lens.

FIG. 15 is a schematic diagram showing the structure of the inverted form of a monolithic capillary quasi-parallel beam X-ray lens, i.e., a monolithic capillary quasi-parallel beam focusing X-ray lens, The size of the incident end of this lens is greater than that of the exit end, the lens profile generatrix of the incident portion is parallel to the X-ray axis 3 of the lens 2, X-ray is incident from the parallel end, and is focused into divergent X-rag beams of high power density at the focus of the exit X-ray The size of the incident end of this lens $D_{in}$ is 2 mm–50 mm, that of the exit end of the lens $D_{out}$ is 1 mm–35 mm, the length of the lens is 10 mm–250 mm, the minimum distance from the portion of the lens having the maximum size to the exit end of the lens is 2 mm–150 mm, the distance f from the exit end of the lens to the minimum focused beam spot is 10 mm–200 mm, and the open area is greater than 10%.

A method for manufacturing said monolithic capillary X-ray lens, comprises the steps of:

1) blowing manually or drawing mechanically hollow tubes of diameter 100 mm–40 mm by the use of a group of boron glass, as raw tubes for manufacturing monolithic capillary X-ray lens;

2) feeding said cleaned raw tubes into a heating furnace of 750° C.–950° C. at uniform speed of 1 mm–30 mm per minute, and pulling them continuously with a drawing machine at a speed of 1 mm–5 m per minute into monocapillaries of diameter 0.3 mm–2 mm, which is referred to as single guiding capillary after cutting into fixed length;

3) stacking said monocapillaries into polygonal mould of symmetric shape or circular mould or rectangular mould, and binding them into polygonal bundle having section of symmetric shape, or circular bundle or rectangular bundle, which is referred to as first multibundle;

4)

a. putting said first multibundle into the high temperature zone of a heating furnace with temperature of 750° C.–950° C. and holding it there to get the drop of the bundle, lowering the temperature and initiating the feeding mechanism and the capstan after pulling the melted drop of the bundle to the pulling rollers;

b. feeding the first multibundle into the furnace at uniform speed of 1 mm–30 mm per minute, at the same time drawing the bundle into multicapillaries at uniform speed of 1 mm–5 m per minute by the capstan;

c. carrying out variable speed drawing and uniform or variable speed feeding using different variable speeds (e.g. uniform acceleration, retardation, etc.) within the above-mentioned range of speeds according to the requirement of the profile and size of the lens, to form-combinations of segments of conics or combination of segments of conics and straight lines;

d. carrying out feeding and drawing again at uniform speed within the range of the above-mentioned speeds, to form segments of straight line;

a billet of the first monolithic quasi-parallel beam X-ray lens can be obtained after the above-mentioned steps have been completed;

e. drawing said billet in reverse direction to abstain a billet of first monolithic capillary focusing X-ray lens;

5) drawing the above-mentioned first multibundle with the same method of said step 2) to form multichannel capillaries of diameter or diameter across sides of 0.5 mm–4.0 mm, which are referred to as first multicapillaries;

6) forming a second multibundle by applying the same method of said step 3) with the first multicapillaries;

7) forming a billet of the second composite monolithic capillary lens by applying the method of said step 4) with said second multibundle; and 8) cutting the billet of said first or second monolithic capillary lens into desired shape according to different usage, to form a monolithic capillary X-ray lens.

The use of the first or second drawn monolithic capillary X-ray lens depends on the number of the desired X-ray channels and the diameter of the channel. First drawing shaping is employed when the required number of X-ray channels is smaller or the diameter of channel is larger, second drawing shaping is employed when the required number of X-ray channels is larger or the diameter of channel is smaller, multi-step drawing can also be employed according to requirement.

A method for manufacturing said monolithic capillary X-ray lens with rigid solid envelope, comprises the steps of:

a) stacking said monocapillaries or said multicapillaries closely into a glass tube having the same shape with said multibundle, or stacking glass fibers of same size as the capillaries around the periphery when stacking the multibundle, to form a multibundle with an envelope;

10) manufacturing a monolithic capillary X-ray lens having rigid solid envelope by the use of the method described in the above-mentioned steps 4), 7) and 8).

Figure 16:
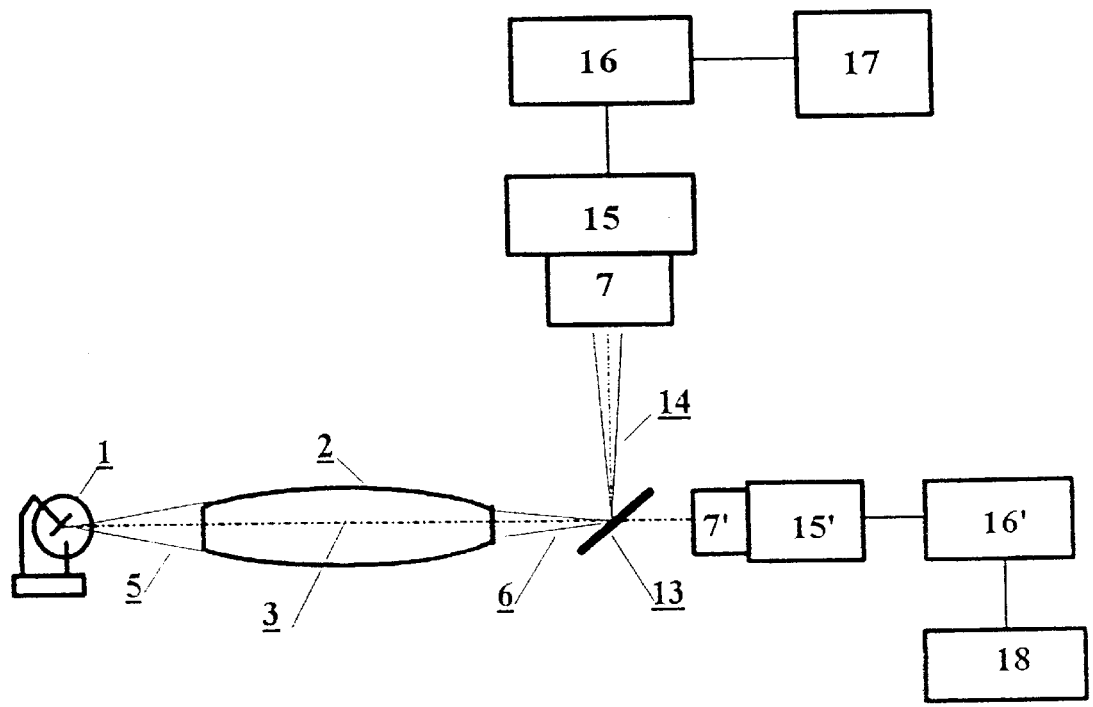
FIG. 16 is a schematic block diagram of an X-ray fluorescence spectrometer with a monolithic capillary focusing X-ray lens.

Referring to FIG. 16, an X-ray fluorescence spectrometer using the monolithic capillary focusing X-ray lens consists of an X-ray source 1, a monolithic capillary focusing X-ray lens 2, detectors 7 and 7',a sample 13, preamplifiers 15 and 15', amplifiers 16 and 16', a PC based multi-analyzer 17, and a ratemeter 18, 3 is the imaginary X-ray axis of the lens 2. The X-ray 5 emitted from the X-ray source 1 is collected and focused by the monolithic capillary focusing lens 2 to form a microbeamspot of diameter less than several mm focused on the sample 13 to be examined. The characteristic X-rays 14 emitted by the activated elements in the sample 13 radiate onto the detector 7, the output from the detector after amplification by the preamplifier 15 and amplifier 16 is sent into the PC based multi-analyzer 17 for analysis and storage, another portion of X-ray induced by the sample 13 is received by the detector 7', the output of the detector is sent to the ratemeter 18 for registration and storage via the preamplifier 15' and amplifier 16', for monitoring the intensity of the X-ray source.

In order to further limit the size of the X-ray beam spot to radiate the X-ray in the central portion of the X-ray beam spot onto the detector 7, to thereby obtain a smaller beam spot and higher X-ray power density, a single guiding tube 10 or aperture 12 can be added after the monolithic capillary focusing X-ray lens 2 to form an X-ray fluorescence spectrometer with lens and capillary or combination of lens and aperture.

Figure 17:
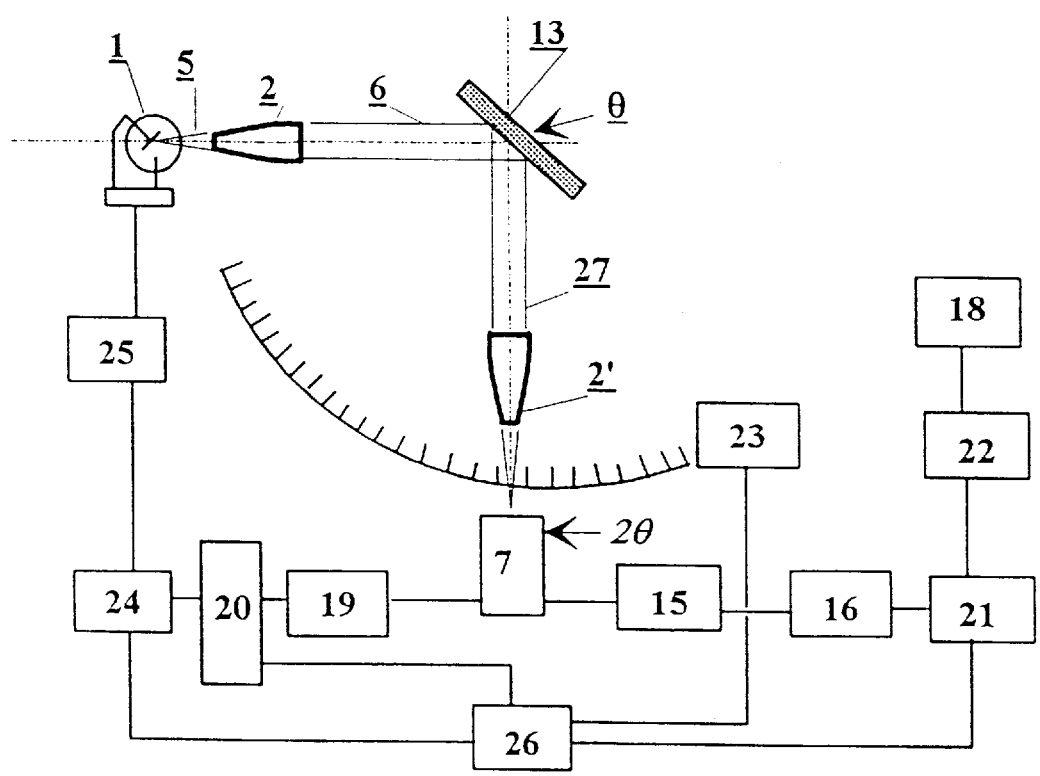
FIG. 17 is a schematic block diagram of an X-ray diffractometer with a monolithic quasi-parallel beam X-ray lens.

Referring to FIG. 17, an X-ray diffractometer using the monolithic quasi-parallel beam X-ray lens consists of an X-ray source 1, a monolithic capillary quasi-parallel beam X-ray lens 2, a monolithic capillary quasi-parallel beam focusing X-ray lens 2', a detector 7, a sample 13, a preamplifier 15, a main amplifier 16, a pulse analyzer 21, a scaler 22, a ratemeter 18, an goniometer 23, an X-ray source control system 24, a high voltage power supply for the X-ray source 25, a computer 26, a power supply 20, a high voltage supply for the detector 19 and etc. The X-ray 5 emitted from the X-ray source 1 is collected by the monolithic capillary quasi-parallel beam X-ray lens 2 to form quasi-parallel beams 6 to be radiated onto the sample 13, the quasi-parallel diffracted beam 27 generated by the sample 13 is incident into the monolithic capillary quasi-parallel beam focusing X-ray lens 2' to be focused and then incident upon the detector 7, the signal output from the detector 7 is sent to the pulse analyzer 21 after two stage amplification of the pre-amplifier 15 and the main amplifier 16, one path of the signal given by the pulse analyzer 21 is sent to the scaler 22 and registered by the ratemeter 18, while the another path is sent to the computer 26 for processing, both the goniometer 23 and the X-ray source control system 24 are controlled by the computer 26.

Figure 18:
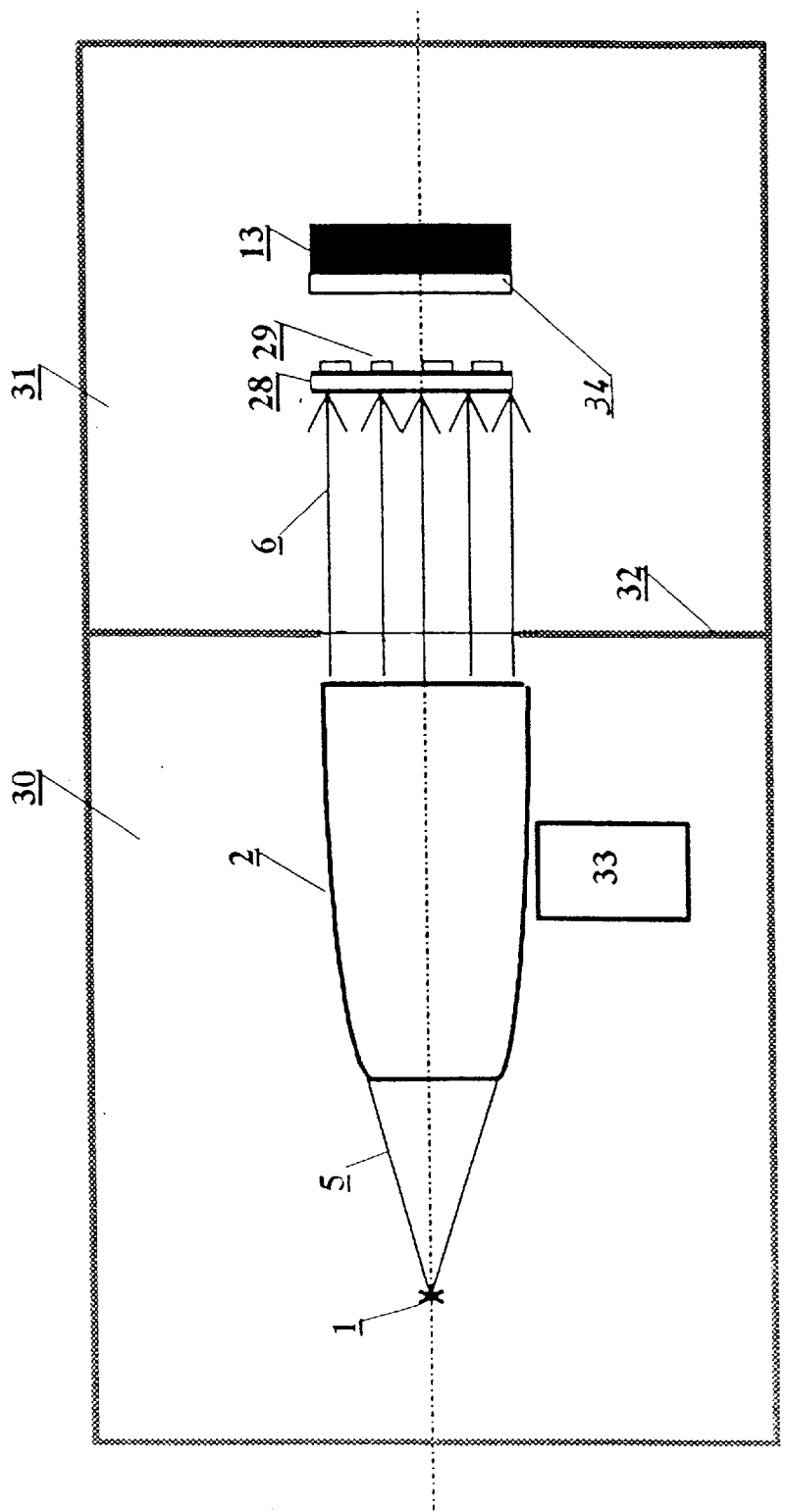
FIG. 18 is a schematic block diagram of a deep submicron X-ray lithography apparatus with a monolithic quasi-parallel beam X-ray lens.

Referring to FIG. 18, a deep submicron X-ray lithography apparatus using the monolithic capillary quasi-parallel beam X-ray lens, comprises a soft X-ray source 1, a monolithic quasi-parallel beam X-ray lens 2, masks 28, mask patterns 29, wafer 13, a vacuum chamber 30, an exposure chamber 31, resist 34, a lens support 33, a vacuum window 32 and etc. The X-ray 5 emitted from the soft X-ray source 1 (the capture angle being ±5°–±15°) enters the monolithic quasi-parallel beam X-ray lens 2, the collection angle of which is great than that of the existing X-ray lithography apparatus by one order of magnitude or more. The X-ray is totally reflected for many times on the walls of capillaries of the channels after its entering into the lens 2, finally quasi-parallel beam soft X-rays having a relatively uniform large area of illuminance are formed and emitted, which transmit through the mask 28 on the stepper when arriving at the stepper, and transfer the pattern 29 of the mask 28 to the resist 34 on the wafer 13, thereby an exposure procedure for the deep submicron lithography is completed.

The present invention has the following advantages:

1. Since directly drawing to form this lens, so the manufacturing process is simple, time saving and low cost.

2. Since this lens is single solid without any supporting, it is compact and miniature in structure and high in mechanical strength, as well as convenient in use and popularization.

3. Since the design of the structure of the monolithic capillary X-ray lens is reasonable, its open area is high, its volumes is small, and the collection angle for the X-ray emitted by the X-ray source is large, so the X-ray transmission efficiency is high and the focusing effect is good.

What is claimed is:

1. A method for manufacturing the monolithic capillary X-ray lens, comprising the steps of:

1). Drawing a hollow glass raw-tube into monocapillaries in a heating furnace by a drawing tower;

2). Stacking monocapillaries into a symmetric mould to form a multibundle;

3). Feeding the multibundle into the heating furnace to be heated at uniform speed or variable speed;

4). Drawing the multibundle by a drawing tower at uniform speed and variable speed to form a first integrated lens billet;

5). Cutting the monolithic lens billet into desired shape according to usage to form said first monolithic capillary X-ray lens.

2. The method for manufacturing monolithic capillary X-ray lens according to claim 1, wherein step 1) comprises steps of:

a. blowing manually or drawing mechanically hollow tubes of diameter 10 mm–40 mm by the use of a group of boron glass, as raw tubes for manufacturing monolithic capillary X-ray lens;

b. feeding said cleaned raw tubes into a heating furnace of 750° C.–950° C. at uniform speed of 1 mm–30 mm per minute, and pulling them continuously with a drawing machine at a speed of 1 mm–5 m per minute into monocapillaries of diameter 0.3 mm–2 mm, which is referred to as single guiding capillary after cutting into fixed length.

3. The method for manufacturing monolithic capillary X-ray lens according to claim 1, wherein step 3) comprises steps of:

a. putting said first multibundle into the high temperature zone of a heating furnace with temperature of 750° C.–950° C. and holding it there to get the drop of bundle, lowering the temperature and initiating the feeding mechanism and the capstan after pulling the melted drop of the bundle to the pulling rollers;

b. feeding the first multibundle into the furnace at uniform speed of 1 mm–30 mm per minute.

4. The method for manufacturing monolithic capillary X-ray lens according to claim 1, wherein step 4) comprises steps of:
   a. carrying out variable speed drawing and uniform or variable speed feeding using different variable speeds within the above-mentioned range of speeds according to the requirement of the profile and size of the lens, to form combinations of segments of conics or combination of segments of conics and straight lines;
   b. carrying out feeding and drawing again at uniform speed within the range of the above-mentioned speeds, to form segments of straight line;
   a billet of the first monolithic quasi-parallel beam X-ray lens can be obtained after the above-mentioned steps have been completed;
   c. drawing said billet in reverse direction to abstain billet of first monolithic capillary focusing X-ray lens.

5. The method for manufacturing monolithic capillary X-ray lens according to claim 4, wherein bundles are drawn into multicapillaries at uniform speed of 1 mm–5 m per minute by the capstan.

6. A method for manufacturing the monolithic capillary X-ray lens, comprising the steps of:
   1). Drawing a hollow glass raw-tube into a monocapillaries in a heating furnace by a drawing tower;
   2). Stacking monocapillaries into a symmetric mould to form a first multibundle;
   3) drawing the above-mentioned first multibundle with the same method of said step 1) to form multichannel capillary of smaller diameter or diameter across sides, which are referred to as second multicapillaries;
   4) forming a second multibundle by applying the same method of said step 2) with the first multicapillaries;
   5). Feeding the second multibundle into the heating furnace to be heated at uniform speed or variable speed;
   6). Drawing the second multibundle by a drawing tower at uniform speed and variable speed to form a second integrated monolithic lens billet;
   7). Cutting the second monolithic lens billet into desired shape according to usage to form a monolithic capillary X-ray lens.

7. The method for manufacturing monolithic capillary X-ray lens according to claim 6, wherein step 1) comprises steps of:
   a. blowing manually or drawing mechanically hollow tubes of diameter 10 mm–40 mm by the use of a group of boron glass, as raw tubes for manufacturing monolithic capillary X-ray lens;
   b. feeding said cleaned raw tubes into a heating furnace of 750° C.–950° C. at uniform speed of 1 mm–30 mm per minute, and pulling them continuously with a drawing machine at a speed of 1 mm–5 m per minute into monocapillaries of diameter 0.3 mm–2 mm, which is referred to as single guiding capillary after cutting into fixed length.

8. The method for manufacturing monolithic capillary X-ray lens according to claim 6, wherein step 3) comprises steps of:
   a. putting said first multibundle into the high temperature zone of a heating furnace with temperature of 750° C.–950° C. and holding it there to get the drop of the bundle, lowering the temperature and initiating the feeding mechanism and the capstan after pulling the melted drop of the bundle to the pulling rollers;
   b. feeding the first multibundle into the furnace at uniform speed of 1 mm–30 mm per minute.

9. The method for manufacturing monolithic capillary X-ray lens according to claim 6, wherein the diameter or diameter across sides of the multichannel capillary is 0.5 mm–4 mm.

10. The method for manufacturing monolithic capillary X-ray lens according to claim 6, wherein step 6) comprises steps of:
    a. carrying out variable speed drawing and uniform or variable speed feeding using different variable speeds (e.g. uniform acceleration, retardation, etc.) within the above-mentioned range of speeds according to the requirement of the profile and size of the lens, to form combinations of segments of conics or combination of segments of conics and straight lines;
    b. carrying out feeding and drawing again at uniform speed within the range of the above-mentioned speeds, to form segments of straight line;
    a billet of the second monolithic quasi-parallel beam X-ray lens can be obtained after the above-mentioned steps have been completed;
    c. drawing said billet in reverse direction to obtain a billet of second monolithic capillary focusing X-ray lens.

11. The method for manufacturing monolithic capillary X-ray lens according to claim 10, wherein bundles are drawn into mucticapillares at uniform speed of 1 mm–5 m per minute by the capstan.

12. The method for manufacturing monolithic capillary X-ray lens according to claim 1 or 6, wherein step 2) comprises:
    stacking said single guiding capillaries or said composite capillaries closely into a glass tube having the same shape with said multibundle, or stacking glass fibers of same size as the capillaries around the periphery when stacking the multibundle, to form a multibundle with an envelope.

13. The method for manufacturing monolithic capillary X-ray lens according to claim 6, wherein between step 1) and step 6), repeatly using the method described in the above mentioned steps 2) to 5) N times according to the usage to form a (N+2)th monolithic capillary X-ray lens, said N is a positive integral more than 0.

14. A monolithic capillary X-ray lens produced by a method comprising the steps of:
    1). Drawing a hollow glass raw-tube into monocapillaries in a heating furnace by a drawing tower,
    2). Stacking monocapillaries into a symmetric mould to form a multibundle;
    3). Feeding the multibundle into the heating furnace to be heated at a uniform speed or variable speed;
    4). Drawing the multibundle by a drawing tower at uniform speed and variable speed to form a first integrated lens billet;
    5). Cutting the monolithic lens billet into desired shape according to usage to form said first monolithic capillary X-ray lens;
    wherein said monolithic capillary X-ray lens comprises a plurality of X-ray channels passing from one end through another end, and is a single glass solid formed by melting together the walls themselves of said X-ray channels.

15. The monolithic capillary X-ray lens according to claim 14, wherein the longitudinal profile generatrix of said lens, the profile generatrices of the X-ray channels and the axes of the X-ray channels are approximately segments of space conics, combinations of segments of conics, or combinations of segments of conics and straight lines, and the radial variations of the profile generatrix of the lens and the profile generatrices of the X-ray channels are symmetric with respect to the imaginary X-ray axis.

16. The monolithic capillary X-ray lens according to claim 14, wherein the incident end section of said lens and sections of the X-ray channels perpendicular to said lens light axis are regular polygons, circles or rectangles, and the shape of the exit end section is similar to that of the incident end section.

17. The monolithic capillary X-ray lens according to claim 16, wherein said lens has a rigid solid envelope.

18. The monolithic capillary X-ray lens according to claim 17, wherein the sizes of said X-ray channels are different at different positions on the sections perpendicular to the X-ray axis of the lens.

19. The monolithic capillary X-ray lens according to claim 18, wherein the sizes of the incident section and exit section of said lens are no more than that of the maximum section.

20. The monolithic capillary X-ray lens according to claim 19, wherein the distance from the X-ray source to the incident end of the lens is 10 mm–200 mm, the distance from the exit end of the X-ray lens to the minimum focused beam spot is 10 mm–500 mm, the length of the lens is 25 mm–200 mm, the size of the incident end of the lens is 1 mm–30 mm, the size of the exit end of the lens is 1 mm–35 mm, and the open area is greater that 5%.

21. The monolithic capillary X-ray lens according to claim 19, wherein a single guiding capillary or aperture is positioned after said lens to form a combination of lens and capillary or a combination of lens and aperture, and the X-ray axis of the single capillary or the Centre of the aperture is positioned on the imaginary X-ray axis of the lens.

22. The monolithic capillary X-ray lens according to claim 21, wherein the shape of the single capillary in the combination of lens is a conical tube, or formed by two partial rotating ellipsoids, or formed by two partial rotating paraboloids.

23. The monolithic capillary X-ray lens according to claim 21, wherein the aperture in the combination of lens and aperture is made of material of medium and heavy elements.

24. The monolithic capillary X-ray lens according to claim 18, wherein the size of the incident end of the lens is less than that of the exit end, and the generatrix of the lens at the exit end is parallel to the imaginary X-ray axis of the lens.

25. The monolithic capillary X-ray lens according to claim 24, wherein different X-ray channels of said lens has different focal distances.

26. The monolithic capillary X-ray lens according to claim 24, wherein the distance from the X-ray source to the incident end of the lens is 10 mm–200 mm, the minimum distance from the incident end of the lens to the portion of maximum size of the lens is 10 mm–150 mm, the length of the lens is 10 mm–250 mm, the size of the incident end of the lens is 1 mm–35 mm, the size of the exit end of the lens is 2 mm–50 mm, and the open area is greater that 10%.

27. The monolithic capillary X-ray lens according to claim 18, wherein the size of the exit end of the lens is less that that of the incident end, and the generatrix of the lens at the incident part is parallel to the imaginary X-ray axis.

28. The monolithic capillary X-ray lens according to claim 27, wherein the size of the incident end of the lens $D_{in}$ is 2 mm–50 mm, the size of the exit end of the lens $D_{out}$ is 1 mm–35 mm, the length of the lens is 10 mm–250 mm, the minimum distance from the part of maximum size of the lens to the exit end of the lens is 10 mm–150 mm, the distance from the exit end of the lens to the minimum focused beam spot is 10 mm–200 mm, and the open area is greater that 10%.

29. An X-ray fluorescence spectrometer employing the lens claimed by claim 19, comprising an X-ray source, a sample, an X-ray lens disposed between the X-ray source and the sample, a detector, an amplifier and a PC based multi-analyzer, wherein said X-ray lens is the monolithic capillary X-ray lens or combination of X-ray lens and capillary or combination of X-ray lens and aperture as claimed by claim 19 or 21.

30. An X-ray diffractometer employing the lens claimed by claim 24, comprising an X-ray source, a sample, a detector, a high voltage power supply, an amplifier, a pulse analyzer, a scaler, a ratemeter, a computer, an X-ray source control system and a goniometer, wherein the monolithic capillary X-ray lens as claimed by claim 24 are disposed between the X-ray source and the sample and/or between the sample and the detector.

31. A deep submicron X-ray lithography apparatus employing the lens as claimed by claim 24, comprising a pulse plasma radiation source, a stepper having masks and wafers placed thereon, a vacuum device, associated power supplies and control systems, wherein a monolithic capillary X-ray lens as claimed by claim 24 is disposed between the X-ray source and the stepper.

32. A monolithic capillary X-ray lens produced by a method comprising the steps of:

1). Drawing a hollow glass raw-tube into monocapillaries in a heating furnace by a drawing tower;

2). Stacking monocapillaries into a symmetric mould to form a first multibundle;

3). drawing the above-mentioned first multibundle with the same method as step 1) to form multichannel capillary of smaller diameter or diameter across sides, which are referred to as second multicapillaries;

4). forming a second multibundle by applying the same method of said step 2) with the first multicapillaries;

5). Feeding the second multibundle into the heating furnace to be heated at uniform speed or variable speed;

6). Drawing the second multibundle by a drawing tower at uniform speed and variable speed to form a second integrated lens billet;

7). Cutting the second monolithic lens billet into desired shape according to usage to form said first monolithic capillary X-ray lens, wherein said monolithic capillary X-ray lens comprises a plurality of X-ray channels passing from one end through another end, and is a single glass solid formed by melting together the walls themselves of said X-ray channels.

33. An X-ray diffractometer employing the lens claimed by claim 27, comprising an X-ray source, a sample, a detector, a high voltage power supply, an amplifier, a pulse analyzer, a scaler, a ratemeter, a computer, an X-ray source control system and a goniometer, wherein the monolithic capillary X-ray lens as claimed by claim 27 are disposed between the X-ray source and the sample and/or between the sample and the detector.

* * * * *